(12) United States Patent
Kim et al.

(10) Patent No.: US 8,003,419 B2
(45) Date of Patent: Aug. 23, 2011

(54) METHOD OF MANUFACTURING LIGHT EMITTING DEVICE

(75) Inventors: Kyoung-kook Kim, Suwon-si (KR); Su-hee Chae, Suwon-si (KR); Young-soo Park, Yongin-si (KR); Taek Kim, Seongnam-si (KR); Moon-seung Yang, Hwaseong-si (KR); Hyung-su Jeong, Yongin-si (KR); Jae-chul Park, Seoul (KR); Jun-youn Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 12/458,900

(22) Filed: Jul. 27, 2009

(65) Prior Publication Data

US 2010/0124798 A1    May 20, 2010

(30) Foreign Application Priority Data

Nov. 18, 2008   (KR) .......................... 10-2008-0114755

(51) Int. Cl.
*H01L 21/00* (2006.01)

(52) U.S. Cl. ................... 438/34; 257/E25.032

(58) Field of Classification Search ............ 438/22, 438/31, 32, 34, 93; 257/88, 103, E25.032
See application file for complete search history.

(56) References Cited

U.S. PATENT DOCUMENTS

| 6,287,882 | B1 | 9/2001 | Chang et al. | |
| 6,462,358 | B1 | 10/2002 | Lin et al. | |
| 6,583,448 | B2 | 6/2003 | Lin et al. | |
| 6,682,950 | B2 | 1/2004 | Yang et al. | |
| 2006/0160257 | A1* | 7/2006 | Wu et al. | 438/22 |
| 2008/0217628 | A1* | 9/2008 | Lee et al. | 257/88 |
| 2009/0072267 | A1* | 3/2009 | Goshonoo et al. | 257/103 |

FOREIGN PATENT DOCUMENTS

| JP | 2006-041479 | 2/2006 |
| KR | 10-2007-0006239 | 1/2007 |

* cited by examiner

*Primary Examiner* — Brook Kebede
(74) *Attorney, Agent, or Firm* — Harness, Dickey & Pierce, P.L.C.

(57) ABSTRACT

Provided is a method of manufacturing a light emitting device from a large-area bonding wafer by using a wafer bonding method using. The method may include forming a plurality of semiconductor layers, each having an active region for emitting light, on a plurality of growth substrates. The method may also include arranging the plurality of growth substrates on which the semiconductor layers are formed on one bonding substrate and simultaneously processing each of the semiconductor layers formed on each of the growth substrates through subsequent processes. The bonding wafer may be formed of a material that reduces or prevents bending or warping due to a difference of thermal expansion coefficients between a wafer material, such as sapphire, and a bonding wafer. According to the above method, because a plurality of wafers may be processed by one process, mass production of LEDs may be possible which may reduce manufacturing costs.

24 Claims, 4 Drawing Sheets

METHOD OF MANUFACTURING LIGHT EMITTING DEVICE

CROSS-REFERENCE TO RELATED APPLICATIONS

This application claims priority under 35 U.S.C. §119 to Korean Patent Application No. 10-2008-0114755, filed on Nov. 18, 2008, in the Korean Intellectual Property Office (KIPO), the entire contents of which are herein incorporated by reference.

BACKGROUND

1. Field

Example embodiments relate to a method of fabricating a light emitting device (LED) from a large-area bonding wafer by using a wafer bonding method.

2. Description of the Related Art

Light emitting diodes (LEDs) including a semiconductor material, for example, a Group III nitride semiconductor, or a Zn—Mg—O-based semiconductor material, may be made small and light and may have a long lifetime. LEDs may be used in many fields. For example, LEDs may be used as general lighting devices, general display devices, car lighting devices, light sources of display devices, and optical communication devices. Various technologies have been developed to increase the efficiency of LEDs. Recently, in order to use a LED as a general lighting device, research on high-output and high-brightness LEDs has been conducted.

LEDs may be manufactured by growing a semiconductor layer on a sapphire substrate or a GaN substrate. However, the sapphire substrate or the GaN substrate may be expensive. Additionally, making the sapphire or the GaN substrates larger may be difficult. For example, sapphire substrates are generally 2-inches wide (although a 4-inch sapphire substrate has been recently introduced). In order to ensure price competitiveness through mass production, larger-size substrates should be provided at a lower price.

In the manufacture of memory devices, 8-inch and 10-inch silicon substrates may be used. Accordingly, because semiconductor equipment may be manufactured in consideration of the use of 8-inch or 10-inch substrates, time and costs may be additionally required in remodeling the equipment for using a 2-inch or 4-inch substrate for manufacturing LEDs. For this, a method of installing a plurality of sapphire substrates on a wafer fixing jig and placing the wafer fixing jig in the equipment has been proposed. However, because a process of installing the sapphire substrates on the wafer fixing jig is performed manually, the yield increase may be limited.

SUMMARY

Example embodiments provide a method of manufacturing a light emitting device (LED), which enables mass production by use of a wafer bonding method using a large-area bonding wafer.

In accordance with example embodiments, a method of manufacturing a light emitting device may include forming a plurality of semiconductor layers on a plurality of growth substrates, wherein each of the plurality of semiconductor layers includes an active layer for emitting light. The method may also include arranging the plurality of growth substrates, with the plurality of semiconductor layers formed thereon, on one bonding substrate. The method may also include simultaneously processing the plurality of semiconductor layers formed on each of the plurality of growth substrates, wherein each growth substrate of the plurality of growth substrates is bonded onto the bonding substrate, so as to allow a surface of each growth substrate to face the bonding substrate.

In accordance with example embodiments, a method of manufacturing a LED may include forming a plurality of semiconductor layers on a plurality of growth substrates, each of the plurality of semiconductor layers having a first electrode and an active region for emitting light. The method may also include arranging the plurality of growth substrates, with the semiconductor layers formed thereon, on one bonding substrate so that at least one of the first electrodes of the plurality of semiconductor layers faces the bonding substrate. The method may also include bonding at least one of the first electrodes of the plurality of semiconductor layers to the bonding substrate, removing the plurality of growth substrates, and simultaneously processing the plurality of semiconductor layers.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIG. 1 is a schematic cross-sectional view illustrating a structure in which a semiconductor layer is grown on a growth substrate, according to example embodiments;

FIG. 3 is a schematic plan view illustrating a state where the plurality of growth substrates on which the semiconductor layer of FIG. 1 is respectively formed may be bonded onto the bonding substrate, according to example embodiments;

FIG. 4 is a schematic cross-sectional view illustrating a structure of a light emitting device (LED) in which a semiconductor layer may be processed through subsequent processes, according to example embodiments;

FIG. 5 is a schematic cross-sectional view illustrating a structure in which a semiconductor layer is grown on a growth substrate, according to example embodiments;

FIG. 6 is a schematic cross-sectional view illustrating a state where a plurality of growth substrates on which the semiconductor layer of FIG. 5 is respectively formed may be bonded onto a bonding substrate, according to example embodiments;

FIG. 7 is a schematic cross-sectional view illustrating process for removing the growth substrate, according to example embodiments; and FIG. 8 is schematic cross-sectional view illustrating a structure of a LED in which a semiconductor layer may be processed through subsequent processes, according to example embodiments.

DETAILED DESCRIPTION

Figure 1:

Example embodiments will now be described more fully with reference to the accompanying drawings, in which example embodiments are shown. Example embodiments may, however, be embodied in different forms and should not be construed as limited to the embodiments set forth herein. Rather, example embodiments are provided so that this disclosure will be thorough and complete, and will fully convey the scope of example embodiments to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

FIGS. 1 through 4 schematically illustrate a process for manufacturing a light emitting device (LED) from a large-area bonding wafer by using a wafer bonding method, according to example embodiments.

Referring to FIG. 1, a semiconductor layer 20 may be grown on a growth substrate 11. The semiconductor layer 20 may include a first semiconductor layer 21, an active layer 22, and a second semiconductor layer 23. In accordance with example embodiments, the first semiconductor layer 21, the active layer 22, and the second semiconductor layer 21 may be sequentially grown on the growth substrate 11.

The first semiconductor layer 21, the active layer 22, and the second semiconductor layer 23 may be formed of a Group III nitride semiconductor material and the growth substrate 11 may be a sapphire substrate. For example, the first semiconductor layer 21, the active layer 22, and the second semiconductor layer 23 may be formed of GaN, or a Zn—Mg—O-based semiconductor material. According to example embodiments, the first semiconductor layer 21 may be an n-semiconductor layer doped with an n-type material, and the second semiconductor layer 23 may be a p-semiconductor layer doped with a p-type material. Alternatively, the first semiconductor layer 21 may be doped with a p-type material, and the second semiconductor layer 23 may be doped with an n-type material. The active layer 22, which is an active region for generating light by recombination of electrons and holes, may have a single- or multi-quantum well structure.

Although not shown in the drawing, a buffer layer for improving crystal quality may be additionally interposed between the growth substrate 11 and the second semiconductor layer 21. The above process may be the same as a process for manufacturing a conventional LED, thus its detailed description will be omitted. Hereinafter, all of the first semiconductor layer 21, the active layer 22, and the second semiconductor layer 23 will be referred to as a semiconductor layer 20 for convenience. Accordingly, in the following description of the drawings, only one layer denoted as the semiconductor layer 20 will be illustrated for convenience.

Figure 2A:
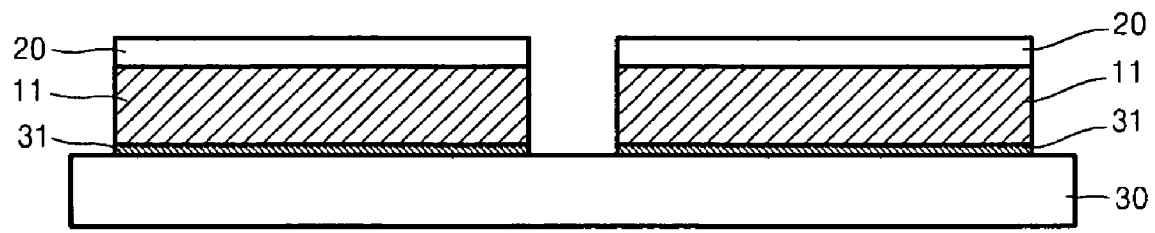
FIGS. 2A and 2B are schematic cross-sectional views illustrating a state where a plurality of growth substrates on which the semiconductor layer of FIG. 1 is respectively formed may be bonded onto a bonding substrate, according to example embodiments.
Figure 2B:
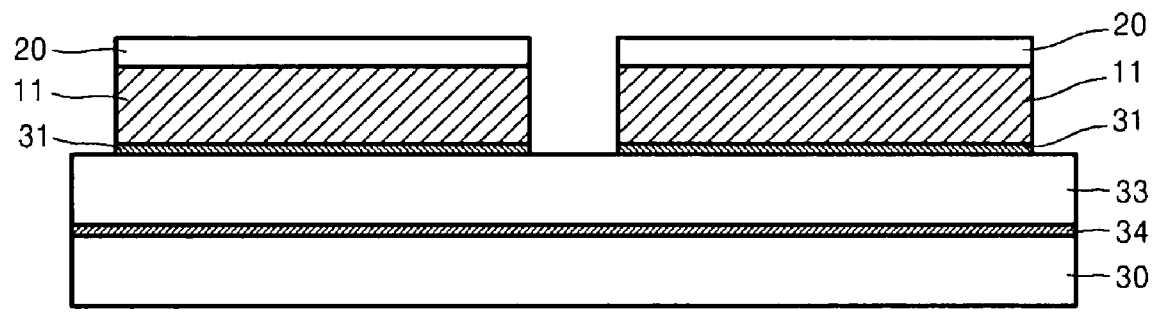
Figure 3:
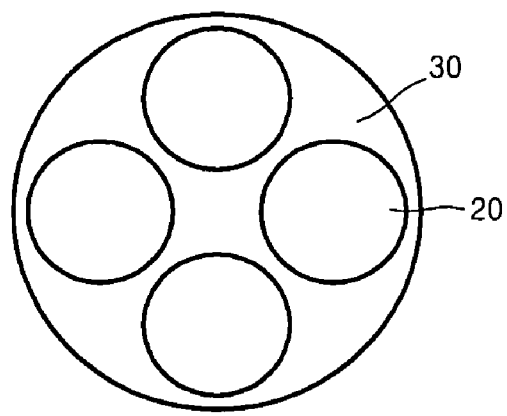

Referring to FIGS. 2A-3, a plurality of growth substrates 11, on which the semiconductor layer 20 is formed, may be arranged on one bonding substrate 30 and bonded using a wafer bonding method. The growth substrate 11 and the bonding substrate 30 may be bonded with each other by using an eutectic bonding material, for example, an AuSn alloy or an AuGe alloy, as a bonding material layer 31. For example, the bonding material layer 31 may be formed by e-beam deposition, atomic layer deposition (ALD), chemical vapor deposition (CVD), or physical vapor deposition (PVD), and the bonding material layer 31 may be formed to have a thickness in the range of from about 0.5 to about 3 µm. In accordance with FIG. 2A, a surface of the growth substrate 11 may face the bonding substrate 30.

The growth substrate 11 may be a sapphire substrate or a GaN substrate having a diameter of 2 inches or 4 inches. The bonding substrate 30 may be a substrate having a diameter of 8 inches or 10 inches, which may be used in a general semiconductor manufacturing process. Accordingly, the plurality of growth substrates 11 may be arranged and bonded onto one bonding substrate 30. In FIG. 3, four growth substrates 11, each on which the semiconductor layer 20 is respectively formed, may be arranged on the bonding substrate 30. However, more growth substrates 11 may be arranged on the bonding substrate 30 according to the sizes of the growth substrate 11 and the bonding substrate 30. According to example embodiments, a bonding substrate 30 on which the plurality of growth substrates 11 are arranged may be placed in a semiconductor process equipment to perform subsequent processes. Accordingly, remodeling a conventional semiconductor process equipment using an 8-inch or 10-inch substrate for use with a 2-inch—or 4-inch substrate may not be necessary, and a plurality of semiconductor layers 20 may be processed simultaneously, thus mass production of a LED may be possible.

The bonding between the growth substrate 11 and the bonding substrate 30 may be performed at a temperature above a melting point of the bonding material layer 31. In this process, because the growth substrate 11 and the bonding substrate 30 are heated and then cooled together, a material for forming the bonding substrate 30 may be chosen from among materials having a thermal expansion coefficient similar to that of the growth substrate 11. Otherwise, bending or warping may occur due to a difference of the thermal expansion coefficients between the growth substrate 11 and the bonding substrate 30 in the cooling process. For example, a thermal expansion coefficient of a sapphire substrate that may be used as the growth substrate 11 of a LED is about 7×10−6 Å/K, on the other hand, a thermal expansion coefficient of a silicon substrate generally used as a semiconductor substrate is about 2.4 to 3.6×10−6 Å/K. Accordingly, when a silicon substrate is used as the bonding substrate 30, bending or warpage may occur in the wafer bonding process, and a crack may be generated in the semiconductor layer 20.

According to example embodiments, bending and warping may be prevented or reduced by using a material having a thermal expansion coefficient of about 5 to about 8×10−6 Å/K for the bonding substrate 30. For example, borosilicate glass has a thermal expansion coefficient of about 7.2×10−6 Å/K similar to that of sapphire, and accordingly, the borosilicate glass may be used as the bonding substrate 30. In addition to the borosilicate glass, silicate-based glass may be controlled to have various thermal expansion coefficients according to its composition or manufacturing temperature. Accordingly, because the thermal expansion coefficient of silicate-based glass may be similar to that of the growth substrate 11, the silicate-based glass may be used as the bonding substrate 30. Furthermore, the silicate-based glass may be easily purchasable, may not be expensive, may allow large-area manufacturing and may be used in a high-temperature or low-temperature process. In addition to the silicate-based glass, various materials having a thermal expansion coefficient of about 5 to about 8×10−6 Å/K may be used to manufacture the bonding substrate 30. For example, the materials may be a titanium-based carbide material, a tantalum-based carbide material, a tungsten-based carbide material, a zirconium-based carbide material, steatite, zirconium or an alloy thereof, iridium, zirconia, rhodium, boron nitride, columbium or an alloy thereof, alumina ceramics, hafnium, molybdenum or an alloy thereof.

Bending and warping may also be reduced or prevented by interposing a stress relaxation layer 33 between the growth substrate 11 and the bonding substrate 30 as shown in FIG. 2B. In accordance with example embodiments, the stress relaxation layer 33 may be formed of a metal sheet. For example, a bonding material layer 34 may be interposed between the bonding substrate 30 and the stress relaxation layer 33, and a bonding material layer 31 may be interposed between the stress relaxation layer 33 and the growth substrate 11. The bonding material layers 31 and 34 may be melted to bond these layers. Because the stress relaxation layer 33 absorbs a difference of the thermal expansion coefficients between the bonding substrate 30 and the growth substrate 11, bending or warping during a cooling process after the bonding process may be reduced or prevented. Accordingly, in the case of using the stress relaxation layer 33, choosing the material of forming the bonding substrate 30 may be unrestricted.

The stress relaxation layer 33 may be formed from a flexible material that has a melting point greater than that of the bonding material layers 31 and 34 so that transformation of the stress relaxation layer 33 does not occur during the bonding process. Examples of materials that satisfy the above conditions may be chrome (Cr), nickel (Ni), tin (Sn), molybdenum (Mo), titanium (Ti), copper (Cu), or an alloy thereof. In accordance with example embodiments, a flexible stress relaxation layer 33 interposed between the bonding substrate 30 and the growth substrate 11, reduces the stress between the bonding substrate 30 and the growth substrate 11 due to the flexibility of the metal sheet interposed therebetween. Therefore, even if the bonding substrate 30 and the growth substrate 11 thermally grow at different rates, the stress between them may be reduced or prevented due to the presence of the flexible stress layer 33 interposed therebetween.

In order to enable the difference of the thermal expansion coefficients between the bonding substrate 30 and the growth substrate 11 to be sufficiently absorbed, the stress relaxation layer 33 may be required to be relatively thick. For example, a stress relaxation layer 33 formed of a metal sheet may be formed to have a thickness in the range of about 10 μm to about 1 mm, and more particularly, from about 50 μm to about 300 μm. As shown in FIG. 2B, the stress relaxation layer 33 may be formed to have a single-layered structure, however, example embodiments are not limited thereto. For example, the stress relaxation layer 33 may be formed to have a multi-layered structure in which different materials are stacked.

Figure 4:
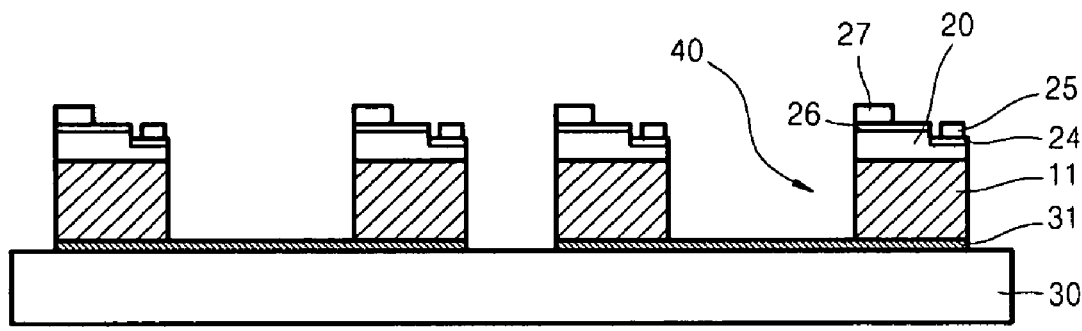

As illustrated in FIG. 2A or FIG. 2B, a plurality of growth substrates 11 upon which the semiconductor layer 20 is formed may be bonded onto the bonding substrate 30. In accordance with example embodiments, the plurality of semiconductor layers 20 may be simultaneously processed through subsequent processes to complete a LED. FIG. 4 illustrates a structure of a LED completed through the subsequent processes. The subsequent processes, after the wafer bonding, may be performed in the same manner as a general process of manufacturing a LED, except for the fact that a plurality of semiconductor layers 20 may be simultaneously processed.

For example, in order to form a plurality of LED chips with one semiconductor layer 20 formed on one growth substrate 11, the semiconductor layer 20 may be partially etched and then divided into a plurality of regions. In accordance with example embodiments, one LED may be manufactured in every region. For example, each region of the semiconductor layer 20 may be partially etched until a part of the first semiconductor layer 21 is exposed. Referring to FIG. 4, a first electrode 24 may be formed on the etched portion of each region of the semiconductor layer 20, and a second electrode 26 may be formed on a portion that is not etched. The second electrode 26 may be a transparent electrode transmitting light, for example, indium tin oxide (ITO). A first bonding metal layer 25 may be connected to the first electrode 24, and a second bonding metal layer 27 may be connected to the second electrode 26. The bonding metal layers 25 and 27 may be coupled with a wire connected to a lead frame of a package (not shown) when packaging a completed LED 40. Accordingly, a current applied through the wire from the lead frame may flow to the first and second electrodes 24 and 26 through the first and second bonding metal layers 25 and 27, respectively.

After the LED 40 is completed, the bonding substrate 30 may be removed and each LED 40 may be separated and individually packaged. However, example embodiments are not limited thereto. For example, the bonding substrate 30 and the LED 40 may be cut-off and packaged together without separating the bonding substrate 30.

The LED 40 illustrated in FIG. 4 is a horizontal type LED. However, example embodiments are not limited thereto. For example, example embodiments also provide for a vertical type LED in which electrodes may be directly located in an upper surface and a lower surface of a semiconductor layer. FIGS. 5 through 8 schematically illustrate a process of manufacturing a vertical type LED from a large-area bonding wafer by using a wafer bonding method.

Figure 5:
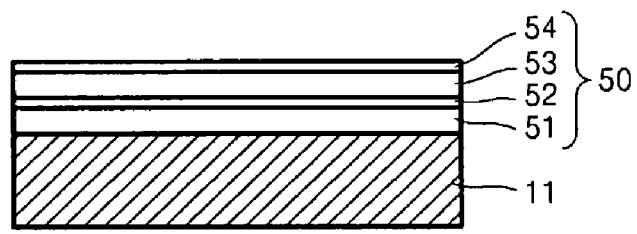
Figure 6:
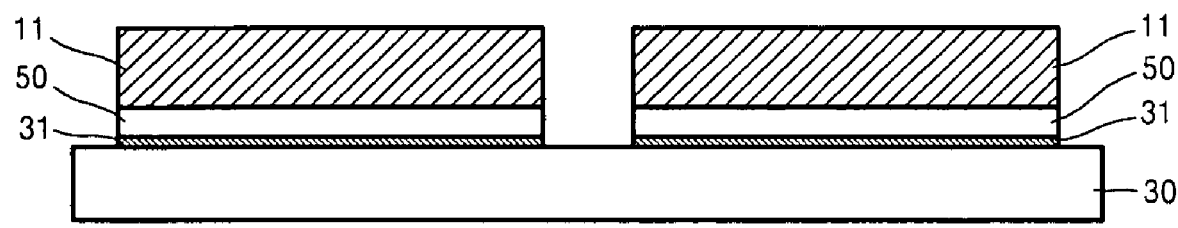

Referring to FIG. 5, a first semiconductor layer 51, an active layer 52, and a second semiconductor layer 53 may be sequentially grown on a growth substrate 11. A first electrode 54 may be grown on the second semiconductor layer 53. Materials for forming the growth substrate 11, the first semiconductor layer 51, the active layer 52, and the second semiconductor layer 53 may be the same as described with reference to FIG. 1. For example, the first semiconductor layer 51 may be an n-semiconductor layer, the second semiconductor layer 53 may be a p-semiconductor layer, and the first electrode 54 may be a p-type electrode. However, example embodiments are not limited thereto. For example, the first semiconductor layer 51 may alternatively be a p-semiconductor layer and the second semiconductor layer 53 and the first electrode 54 may be an n-type electrode. Hereinafter, all of the first semiconductor layer 51, the active layer 52, the second semiconductor layer 53, and the first electrode 54 will be referred to as a semiconductor layer 50 for convenience. Accordingly, in the following description of drawings, only one layer denoted as the semiconductor layer 50 will be illustrated for convenience.

In accordance with example embodiments, a plurality of growth substrates 11 each of which includes a semiconductor layer 50 formed thereon may be arranged and bonded onto one bonding substrate 30 through a wafer bonding method. Unlike in the embodiment illustrated in FIG. 2A, the semiconductor layer 50 may be bonded to the bonding substrate 30 so that the growth substrate 11 faces upward. In particular, a surface of the first electrode 54 and a surface of the bonding substrate 30 may be bonded with each other through the bonding material layer 31 by allowing the first electrode 54 of the semiconductor layer 50 to face the bonding substrate 30. The other descriptions are similar to the descriptions with regard to FIGS. 2A, 2B, and 3.

For example, the growth substrate 11 may be a sapphire substrate or a GaN substrate having a diameter of 2 inches or 4 inches. The bonding substrate 30 may be a substrate having a diameter of 8 inches or 10 inches used in a general semiconductor manufacturing process. Accordingly, a plurality of semiconductor layers 50 may be arranged on one bonding substrate 30. The bonding substrate 30 may be formed of a material having a thermal expansion coefficient similar to that of the growth substrate 11, for example, a silicate-based glass or the aforementioned other materials. Alternatively, an additional stress relaxation layer may be interposed between the bonding substrate 30 and the semiconductor layer 50.

Figure 7:
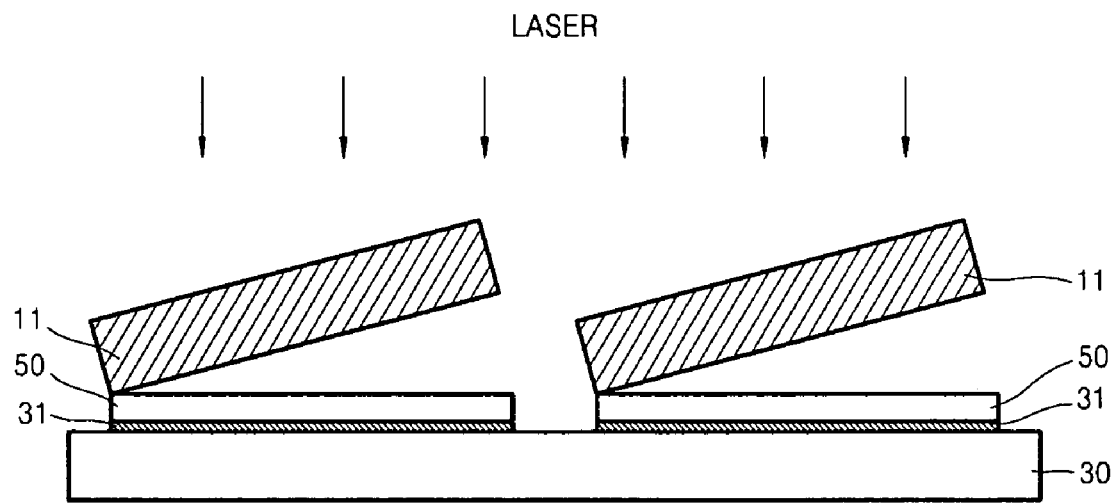

As illustrated in FIG. 7, the growth substrate 11 formed on the semiconductor layer 50 may be removed using a laser lift-off (LLO) method to expose the semiconductor layer 50. In particular, referring to FIG. 5, the first semiconductor layer 51 of the semiconductor layer 50 may be externally exposed.

Figure 8:
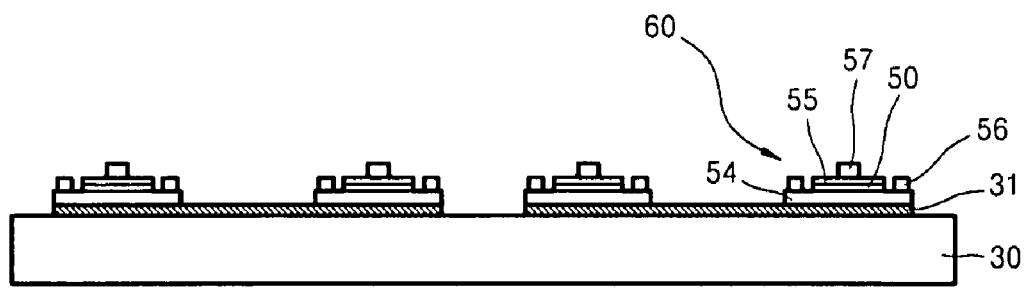

As outlined above, the growth substrate 11 may be removed resulting in a bonding substrate 30 on which the plurality of semiconductor layers 50 are arranged. The bonding substrate on which the plurality of semiconductor layers 50 are arranged may be placed in semiconductor processing equipment to process the semiconductor layers 50 to simultaneously process the semiconductor layers 50 to complete a LED via subsequent processes. FIG. 8 illustrates a state where the manufacture of the LED may be completed through the subsequent processes. The subsequent process may be performed in the same manner as a manufacturing process for a general vertical type LED, except for the fact that a plurality of semiconductor layers 50 may be simultaneously processed.

For example, in order to form a plurality of LED chips of each semiconductor layer 50 formed on a bonding substrate 30, each semiconductor layer 50 may be partially etched and divided into a plurality of regions. One LED may be manufactured on each of the divided regions. For example, a circumference of the each of the divided regions of the semiconductor layer 50 may be partially etched, and the first electrode 54 of the semiconductor layer 50 in the circumference of the divided each region may be partially exposed.

Referring to FIG. 8, a second electrode 55 may be formed on a portion that is not etched in each region of the semiconductor layer 50. Accordingly, the second electrode 55 may be formed on the first semiconductor layer 51 of the semiconductor layer 50. The second electrode 55 may be a transparent electrode transmitting light such as ITO. A first bonding metal layer 56 may be connected to the first electrode 54, and a second bonding metal layer 57 may be connected to the second electrode 55. In FIG. 8, the first bonding metal layers 56 may bee arranged on both sides of the semiconductor layer 50. However, the first bonding metal layer 56 may be formed in a ring-shape surrounding the circumference of the semiconductor layer 50.

Thus, the vertical type LED 60 may be completed. As described above, after the LED 60 is completed, the bonding substrate 30 may be separated, and each LED 60 may be separated and individually packaged. Alternatively, the bonding substrate 30 and the LED 60 may be cut-off and packaged together without separating the bonding substrate 30.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of manufacturing a light emitting device, the method comprising:
   forming a plurality of semiconductor layers on a plurality of growth substrates, each of the plurality of semiconductor layers including an active layer for emitting light;
   arranging the plurality of growth substrates with the plurality of semiconductor layers formed thereon on one bonding substrate; and
   simultaneously processing the plurality of semiconductor layers formed on each of plurality of the growth substrates,
   wherein
     each growth substrate of the plurality of growth substrates is bonded onto the bonding substrate so as to allow a surface of each growth substrate to face the bonding substrate, and
     the plurality of semiconductor layers formed on each of the plurality of the growth substrates are processed after the plurality of growth substrates with the plurality of semiconductor layers formed thereon are arranged on the one bonding substrate.

2. The method of claim 1, further comprising:
   forming a stress relaxation layer between the plurality of growth substrates and the bonding substrate.

3. The method of claim 2, wherein forming the stress relaxation layer includes forming the stress relaxation layer with metal having a thickness from about 10 μm to about 1 mm.

4. The method of claim 2, wherein the stress relaxation layer includes one of chrome (Cr), nickel (Ni), tin (Sn), molybdenum (Mo), titanium (Ti), copper (Cu), and an alloy thereof.

5. The method of claim 1, wherein the plurality of growth substrates is a plurality of sapphire substrates, and the bonding substrate has a thermal expansion coefficient in the range of about $5 \times 10^{-6}$ Å/K to about $8 \times 10^{-6}$ Å/K.

6. The method of claim 5, wherein the bonding substrate is a glass-based substrate.

7. The method of claim 5, wherein the bonding substrate is formed from one of a Ti-based carbide material, tungsten-based carbide material, zirconium-based carbide material, a silicate glass-based material, steatite, zirconia, rhodium, boron nitride, columbium, alumina ceramics, hafnium, and molybdenum.

8. The method of claim 1, further comprising:
dividing the plurality of semiconductor layers into a plurality of regions;
partially etching a portion of each of the plurality of divided regions of the plurality of semiconductor layers;
forming a plurality of first electrodes on an etched portion of each of the plurality of divided regions of the plurality of semiconductor layers and forming a plurality of second electrodes on portions of each of the plurality of divided regions of the plurality of semiconductor layers that is not etched; and
connecting a plurality of first bonding metal layers to the plurality of first electrodes, and connecting a plurality of second bonding metal layers to the plurality of second electrodes.

9. A method of manufacturing a light emitting device, the method comprising:
forming a plurality of semiconductor layers on a plurality of growth substrates, each of the plurality of semiconductor layers including an active layer for emitting light;
arranging the plurality of growth substrates with the plurality of semiconductor layers formed thereon on one bonding substrate;
forming a stress relaxation layer between the plurality of growth substrates and the bonding substrate;
forming a bonding material layer between the plurality of growth substrates and the stress relaxation layer and between the stress relaxation layer and the bonding substrate; and
simultaneously processing the plurality of semiconductor layers formed on each of plurality of the growth substrates,
wherein each growth substrate of the plurality of growth substrates is bonded onto the bonding substrate so as to allow a surface of each growth substrate to face the bonding substrate.

10. The method of claim 9, wherein forming the bonding material layer includes forming the bonding material layer to have a thickness in the range of about 0.5 μm to about 3 μm.

11. The method of claim 9, wherein forming the stress relaxation layer includes forming the stress relaxation layer of a material having a melting point greater than that of the bonding material layers.

12. A method of manufacturing a LED, the method comprising:
forming a plurality of semiconductor layers on a plurality of growth substrates, each of the plurality of semiconductor layers having a first electrode and an active region for emitting light;
arranging the plurality of growth substrates with the plurality of semiconductor layers formed thereon on one bonding substrate so that at least one of the first electrodes of the plurality of semiconductor layers faces the bonding substrate;
bonding at least one of the first electrodes of the plurality of semiconductor layers to the bonding substrate;
removing the plurality of growth substrates; and
simultaneously processing the plurality of semiconductor layers.

13. The method of claim 12, further comprising:
forming a stress relaxation layer between the first electrodes and the bonding substrate.

14. The method of claim 13, wherein forming the stress relaxation layer includes forming the stress relaxation layer with metal having a thickness in the range of about 10 μm to about 1 mm.

15. The method of claim 13, further comprising:
forming a bonding material layer between the first electrode and the stress relaxation layer and between the stress relaxation layer and the bonding substrate.

16. The method of claim 15, wherein forming the bonding material layer includes forming the bonding material layer to have a thickness in the range of about 0.5 μm to about 3 μm.

17. The method of claim 15, wherein forming the stress relaxation layer includes forming the stress relaxation layer of a material having a melting point greater than that of the bonding material layer.

18. The method of claim 13, wherein the stress relaxation layer includes one of Cr, Ni, Sn, Mo, Ti, Cu, and an alloy thereof.

19. The method of claim 12, wherein the plurality of growth substrates is a plurality of sapphire substrates, and the bonding substrate has a thermal expansion coefficient in the range of about $5 \times 10^{-6}$ Å/K to $8 \times 10^{-6}$ Å/K.

20. The method of claim 19, wherein the bonding substrate is a glass-based substrate.

21. The method of claim 19, wherein the bonding substrate is one of titanium, tungsten or zirconium-based carbide material, silicate glass-based material, steatite, zirconia, rhodium, boron nitride, columbium, alumina ceramics, hafnium, and molybdenum.

22. The method of claim 12, further comprising:
dividing the plurality of semiconductor layers into a plurality of regions;
partially etching a circumference of each of the plurality of divided regions of each of the plurality of semiconductor layers; and
forming second electrodes on portions of the plurality of divided regions that are not partially etched.

23. The method of claim 22, wherein partially etching the circumference of each of the plurality of divided regions is performed until the first electrode is exposed.

24. The method of claim 23, further comprising:
connecting a first bonding metal layer to the first electrode; and
connecting a second bonding metal layer to the second electrode.

* * * * *